(12) United States Patent
Beak et al.

(10) Patent No.: US 10,795,472 B2
(45) Date of Patent: Oct. 6, 2020

(54) DISPLAY DEVICE

(71) Applicant: LG Display Co., Ltd., Seoul (KR)

(72) Inventors: Jung-Sun Beak, Paju-si (KR); Seong-Joo Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 42 days.

(21) Appl. No.: 15/977,989

(22) Filed: May 11, 2018

(65) Prior Publication Data

US 2018/0329554 A1    Nov. 15, 2018

(30) Foreign Application Priority Data

May 12, 2017    (KR) .................... 10-2017-0059435

(51) Int. Cl.
| | |
|---|---|
| *G06F 3/041* | (2006.01) |
| *H01L 27/32* | (2006.01) |
| *H01L 51/52* | (2006.01) |
| *G06F 3/044* | (2006.01) |
| *H01L 51/50* | (2006.01) |
| *G09G 3/3233* | (2016.01) |
| *G06F 3/047* | (2006.01) |

(52) U.S. Cl.
CPC ............ *G06F 3/0412* (2013.01); *G06F 3/044* (2013.01); *G06F 3/047* (2013.01); *G09G 3/3233* (2013.01); *H01L 27/323* (2013.01); *H01L 27/3246* (2013.01); *H01L 27/3262* (2013.01); *H01L 27/3276* (2013.01); *H01L 51/5036* (2013.01); *H01L 51/5206* (2013.01); *H01L 51/5221* (2013.01); *G06F 2203/04111* (2013.01); *G06F 2203/04112* (2013.01); *H01L 27/322* (2013.01); *H01L 51/5253* (2013.01)

(58) Field of Classification Search
CPC .. G06F 2203/04111; G06F 2203/04112; G06F 3/0412; G06F 3/044; H01L 27/322; H01L 27/323; H01L 27/3262; H01L 27/3276; H01L 51/5012; H01L 51/5206; H01L 51/5221; H01L 51/5253; H01L 51/5284
See application file for complete search history.

(56) References Cited

U.S. PATENT DOCUMENTS

| | | | |
|---|---|---|---|
| 2014/0117316 A1* | 5/2014 | Choi | .................... H01L 51/5253 257/40 |
| 2016/0117031 A1* | 4/2016 | Han | ..................... G06F 3/0412 345/174 |
| 2017/0115786 A1* | 4/2017 | Kimura | ................... G06F 3/044 |
| 2017/0315641 A1* | 11/2017 | Cai | ....................... G06F 3/0412 |

* cited by examiner

*Primary Examiner* — Insa Sadio
(74) *Attorney, Agent, or Firm* — Seed Intellectual Property Law Group LLP

(57) ABSTRACT

Disclosed is a display device which may achieve process simplification and cost reduction. The display device having touch sensors includes display pads arranged in a non-active area on a substrate and having a multilayer structure, an uppermost layer of the display pads is formed of a different material from conductive layers included in the touch sensors arranged on an encapsulation unit, and, thus, damage to the display pads during formation of the touch sensors may be prevented, process margin may be increased and high resolution may be implemented. Further, the touch sensors are arranged on the encapsulation unit without a separate attachment process and, thus, process simplification and cost reduction of the display device may be achieved.

14 Claims, 11 Drawing Sheets

<COMPARATIVE EXAMPLE>

<EXAMPLE>

DISPLAY DEVICE

CROSS-REFERENCE TO RELATED APPLICATION(S)

This application claims the benefit of Korean Patent Application No. 10-2017-0059435, filed May 12, 2017, which is hereby incorporated by reference as if fully set forth herein.

BACKGROUND

Technical Field

The present disclosure relates to a display device, and more particularly, to a display device which may achieve process simplification and cost reduction.

Description of the Related Art

A touchscreen is an input device through which a user command may be input by selecting instructions displayed on a screen of a display device using a human hand or an article. That is, the touchscreen converts a contact position, which directly contacts a human hand or an article, into an electrical signal, and receives instructions selected at the contact position as an input signal. Such a touchscreen may substitute for a separate input device which is connected to the display device and thus operated, such as a keyboard or a mouse, and, thus, the range of use of the touchscreen tends to be gradually extended.

In general, a touchscreen is attached to a front surface of a display panel, such as a liquid crystal display panel or an organic electroluminescent diode display panel, through an adhesive. In this case, since the touchscreen is separately manufactured and then attached to the front surface of the display panel, an attachment process is added and, thus, the overall process is complicated and costs are raised.

BRIEF SUMMARY

Accordingly, the present disclosure is directed to a display device that substantially obviates one or more problems due to limitations and disadvantages of the related art.

An object of the present disclosure is to provide a display device which may achieve process simplification and cost reduction.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device having touch sensors includes display pads arranged in a non-active area on a substrate and having a multilayer structure, wherein an uppermost layer of the display pads is formed of a different material from conductive layers included in the touch sensors arranged on an encapsulation unit, and, thus, damage to the display pads during formation of the touch sensors may be prevented, process margin may be increased and high resolution may be implemented.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Reference will now be made in detail to the preferred embodiments of the present disclosure, examples of which are illustrated in the accompanying drawings.

Figure 1:
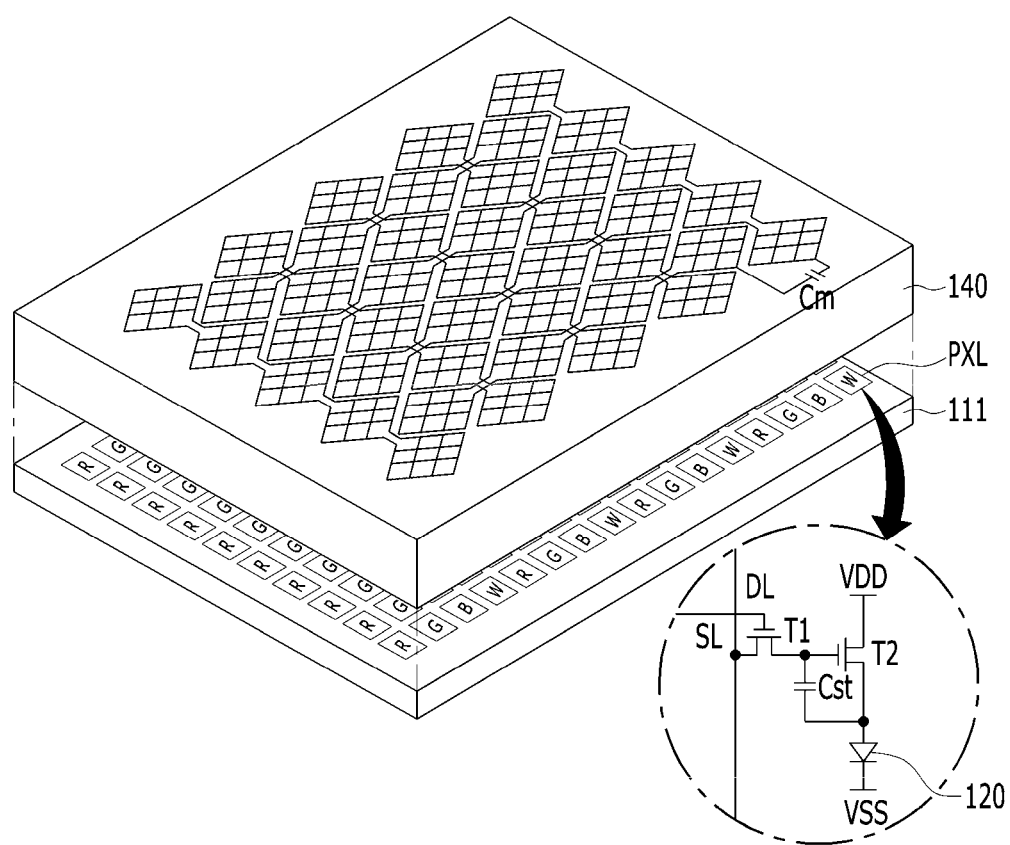
FIG. 1 is a perspective view illustrating an organic light emitting display device having touch sensors in accordance with one embodiment of the present disclosure.

FIG. 1 is a perspective view illustrating an organic light emitting display device having touch sensors in accordance with one embodiment of the present disclosure.

Figure 2:
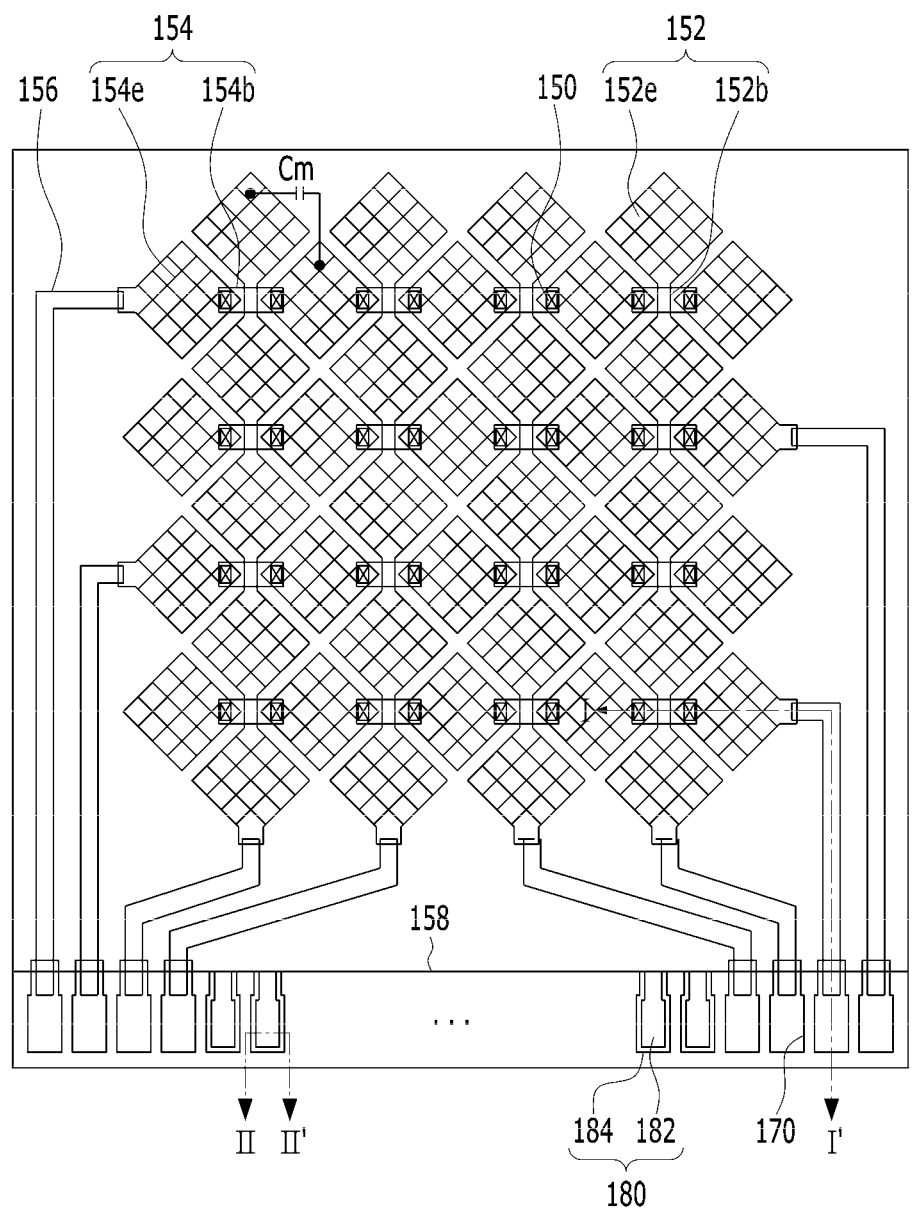
FIG. 2 is a plan view illustrating the organic light emitting display device shown in FIG. 1.

The organic light emitting display device shown in FIG. 1 senses whether or not user touch occurs and a touch position by sensing change in mutual capacitances Cm (touch sensors) due to the user touch through touch electrodes 152e and 154e shown in FIG. 2 during a touch period. Further, the organic light emitting display shown in FIG. 1 displays an image through unit pixels including light emitting elements 120. The unit pixel includes red (R), green (G) and blue (B) sub-pixels PXL, or includes red (R), green (G), blue (B) and white (W) sub-pixels PXL.

For this purpose, the organic light emitting display shown in FIG. 1 includes a plurality of sub-pixels PXL arranged in a matrix on a substrate 111, an encapsulation unit 140 arranged on the sub-pixels PXL, and the mutual capacitances Cm arranged on the encapsulation unit 140.

Each of the sub-pixels PXL includes a pixel driving circuit and the light emitting element 120 connected to the pixel driving circuit.

The pixel driving circuit includes a switching transistor T1, a driving transistor T2 and a storage capacitor Cst.

When a scan pulse is supplied to a scan line SL, the switching transistor T1 is turned on and thus supplies a data signal, supplied to a data line DL, to the storage capacitor Cst and a gate electrode of the driving transistor T2.

The driving transistor T2 controls current I supplied from a high voltage (VDD) supply line to the light emitting element 120 in response to the data signal supplied to the gate electrode of the driving transistor T2, thus adjusting the amount of light emitted from the light emitting element 120. Further, even if the switching transistor T1 is turned off, the driving transistor T2 supplies regular current by voltage charging the storage capacitor Cst until a data signal of a next frame is supplied and, thus, the light emitting element 120 maintains light emission.

Figure 3:
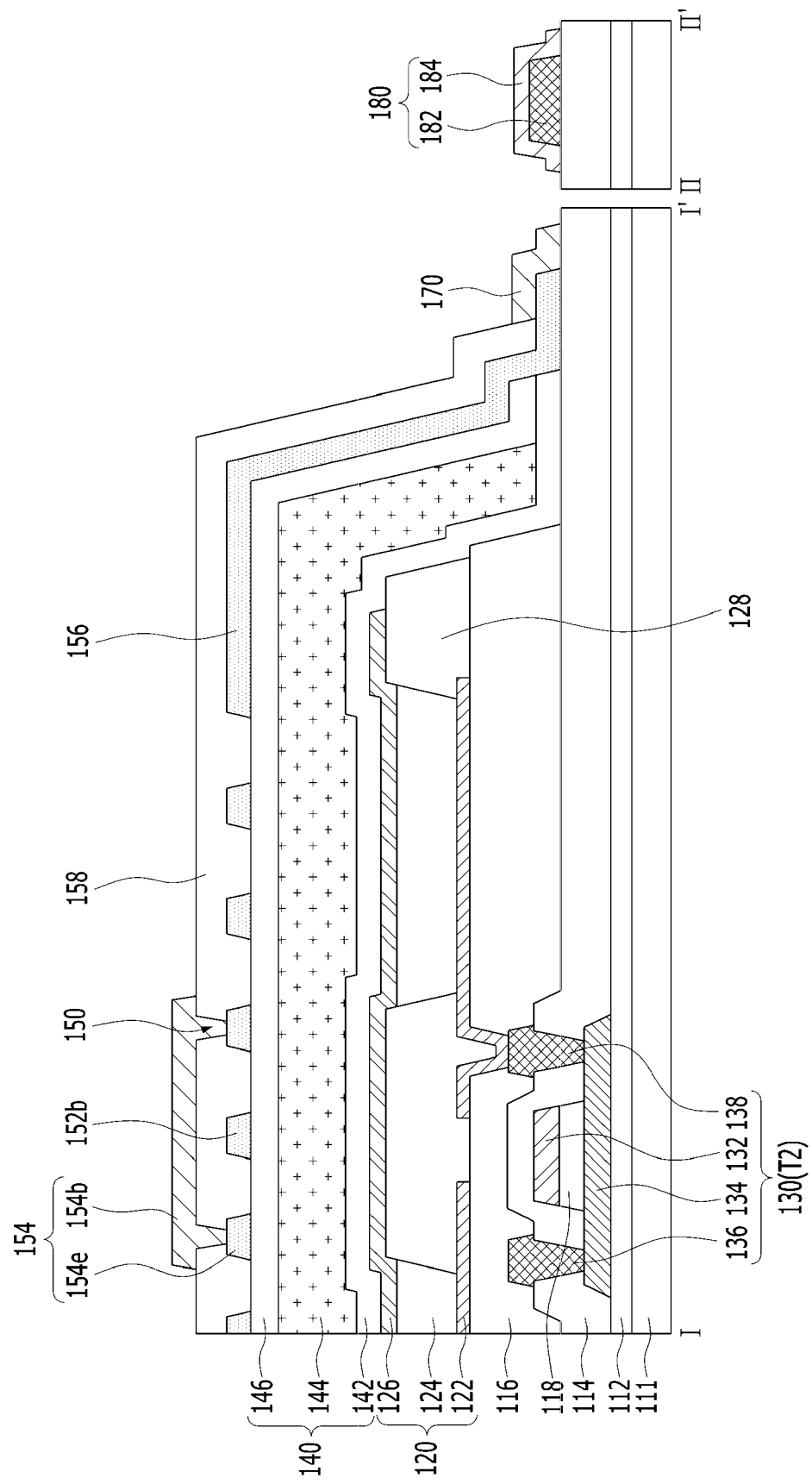
FIG. 3 is a cross-sectional view of the organic light emitting display device shown in FIG. 2, taken along lines I-I' and II-II'.

Such a driving thin film transistor T2 (denoted by 130 in FIG. 3) includes, as exemplarily shown in FIG. 3, a gate electrode 132, a semiconductor layer 134 overlapping the gate electrode 132 with a gate insulating film 118 disposed therebetween, and source and drain electrodes 136 and 138 formed on an interlayer insulating film 114 and contacting the semiconductor layer 134. Here, the semiconductor layer 134 is formed of at least one of an amorphous semiconductor material, a polycrystalline semiconductor material or an oxide semiconductor material, on a buffer layer 112.

The light emitting element 120 includes an anode 122, at least one light emitting stack 124 formed on the anode 122, and a cathode 126 formed on the at least one light emitting stack 124.

The anode 122 is conductively connected to the drain electrode 138 of the driving transistor 130 exposed through a pixel contact hole formed through a protective film 116.

The at least one light emitting stack 124 is formed on the anode 122 in an emission area provided by a bank 128. The at least one light emitting stack 124 is formed by stacking a hole-related layer, an organic light emitting layer and an electron-related layer on the anode 122 in regular order or in reverse order. Further, the at least one light emitting stack 124 may include first and second light emitting stacks disposed opposite to each other with a charge generation layer CGL disposed therebetween. In this case, an organic light emitting layer of one of the first and second light emitting stacks generates blue light and an organic light emitting layer of the other of the first and second light emitting stacks generates yellow-green light and, thus, white light is generated through the first and second light emitting stacks. White light generated by the at least one light emitting stack 124 is incident upon color filters (not shown) located on or under the at least one light emitting stack 124, thus implementing a color image. Otherwise, without separate color filters, each light emitting stack 124 may generate color light corresponding to each sub-pixel, thus implementing a color image. That is, the light emitting stack 124 of the red (R) sub-pixel may generate red light, the light emitting stack 124 of the green (G) sub-pixel may generate green light, and the light emitting stack 124 of the blue (B) sub-pixel may generate blue light.

The cathode 126 is formed opposite to the anode 122 with the at least one light emitting stack 124 disposed therebetween and is connected to a low voltage (VSS) supply line.

The encapsulation unit 140 prevents external moisture or oxygen from penetrating into the light emitting elements 120, which are vulnerable to external moisture or oxygen. For this purpose, the encapsulation unit 140 includes a plurality of inorganic encapsulation layers 142 and 146 and an organic encapsulation layer 144 arranged between the inorganic encapsulation layers 142 and 146, and the inorganic encapsulation layer 146 is arranged as the uppermost layer. Here, the encapsulation unit 140 includes at least two inorganic encapsulation layers 142 and 146 and at least one organic encapsulation layer 144. In the present disclosure, a structure of the encapsulation unit 140, in which the organic encapsulation layer 144 is arranged between the first and second inorganic encapsulation layers 142 and 146, will be exemplarily described.

The first inorganic encapsulation layer 142 is formed on the substrate 111 provided with the cathode 126 formed thereon so as to be located adjacent to the light emitting element 120. Such a first inorganic encapsulation layer 142 is formed of an inorganic insulating material which may be deposited at a low temperature, such as silicon nitride ($SiN_x$), silicon oxide ($SiO_x$), silicon oxynitride (SiON) or aluminum oxide ($Al_2O_3$). Since the first inorganic encapsulation layer 142 is deposited in a low-temperature atmosphere, damage to the light emitting stack 124, which is vulnerable to a high-temperature atmosphere, during a deposition process of the first inorganic encapsulation layer 142, may be prevented.

The organic encapsulation layer 144 serves as a buffer to damp stress between respective layers according to bending of the organic light emitting display device and strengthens planarization performance of the organic light emitting display device. The organic encapsulation layer 144 is formed of an organic insulating material, such as acrylic resin, epoxy resin, polyimide, polyethylene or silicon oxycarbide (SiOC).

The second inorganic encapsulation layer 146 is formed to cover the upper and side surfaces of the organic encapsulation layer 144 and the upper surface of the first inorganic encapsulation layer 142 exposed by the organic encapsulation layer 144. Thereby, the second inorganic encapsulation layer 146 minimizes and prevents penetration of external moisture or oxygen into the first inorganic encapsulation layer 142 and the organic encapsulation layer 144. The second inorganic encapsulation layer 146 is formed of an inorganic insulating material, such as silicon nitride ($SiN_x$), silicon oxide ($SiO_x$), silicon oxynitride (SiON) or aluminum oxide ($Al_2O_3$).

Touch sensing lines 154 and touch driving lines 152 are arranged on the encapsulation unit 140 so as to intersect each other with a touch insulating film 158 disposed therebetween. The term "intersect" is used herein to mean that one element crosses over or overlaps another element, and does not necessarily mean that the two elements contact each other. For example, the touch sensing line 154 and touch driving line 152 may intersect each other, but may not physically contact one another since the touch insulating film 158 is positioned therebetween. The mutual capacitances Cm are formed at the intersections between the touch sensing lines 154 and the touch driving lines 152. Therefore, the mutual capacitance Cm is charged with charges by a touch driving pulse supplied to the touch driving line 152 and discharges the charges to the touch sensing line 154, thus serving as a touch sensor.

The touch driving line 152 includes a plurality of first touch electrodes 152e and first bridges 152b to conductively connect the first touch electrodes 152e.

The first touch electrodes 152e are spaced apart from each other at regular intervals in a first direction, i.e., the Y-axis direction, on the second inorganic encapsulation layer 146. Each of the first touch electrodes 152e is conductively connected to the adjacent first touch electrode 152e through the first bridge 152b.

The first bridges 152b are arranged on the second inorganic encapsulation layer 146 so as to be coplanar with the first touch electrodes 152e, and are conductively connected to the first touch electrodes 152e without separate contact holes.

The touch sensing line 154 includes a plurality of second touch electrodes 154e and second bridges 154b to conductively connect the second touch electrodes 154e.

The second touch electrodes 154e are spaced apart from each other at regular intervals in a second direction, i.e., in the X-axis direction, on the second inorganic encapsulation layer 146. Each of the second touch electrodes 154e is conductively connected to the adjacent second touch electrode 154e through the second bridge 154b.

The second bridges 154b are formed on the touch insulating film 158 and are conductively connected to the second touch electrodes 154e exposed through touch contact holes 150 formed through the touch insulating film 158. In the same manner as the first bridges 152b, the second bridges 154b are arranged so as to overlap the bank 128 and, thus, lowering of an aperture ratio due to the first and second bridges 152b and 154b may be prevented.

Each of the first and second touch electrodes 152e and 154e and the first and second bridges 152b and 154b is formed to have a monolayer structure or a multilayer structure using a conductive layer having high corrosion resistance and acid resistance and excellent conductivity, such as Al, Ti, Cu and Mo. For example, each of the first and second touch electrodes 152e and 154e and the first and second bridges 152b and 154b may have a three-layer structure, such as Ti/Al/Ti or Mo/Al/Mo.

Each of the first and second touch electrodes 152e and 154e and the first and second bridges 152b and 154b is formed as a mesh. Therefore, resistance and capacitance of the first and second touch electrodes 152e and 154e and the first and second bridges 152b and 154b are reduced and, thus, an RC time constant may be lowered and touch sensitivity may be improved. Further, each of the mesh-type first and second touch electrodes 152e and 154e and the mesh-type first and second bridges 152b and 154b has a very thin line width and, thus, lowering of an aperture ratio and transmittance due to the mesh-type first and second touch electrodes 152e and 154e and the mesh-type first and second bridges 152b and 154b may be prevented.

The touch driving lines 152 and the touch sensing lines 154 in accordance with the present disclosure are connected to a touch driving unit (not shown) through routing lines 156 and touch pads 170 arranged in a non-active (bezel) area.

Thereby, the routing lines 156 transmit a touch driving pulse generated by the touch driving unit to the tough driving lines 152 through the touch pads 170, and transmit a touch signal from the touch sensing lines 154 to the touch pads 170. The routing lines 156 are arranged between the first and second touch electrodes 152e and 154e and the touch pads 170 and are directly connected to the first and second touch electrodes 152e and 154e without separate contact holes. The routing lines 156 are formed of the same material as the first bridges 152b through the same mask process as the first bridges 152b and are thus protected by the touch insulating film 158.

The routing lines 156 connected to the first touch electrodes 152e are extended in at least one of the upward or downward directions of the active area and are connected to the touch pads 170, as exemplarily shown in FIG. 2. The routing lines 156 connected to the second touch electrodes 154e are extended in at least one of the leftward or rightward directions of the active area and are connected to the touch pads 170. Arrangement of the routing lines 156 is not limited to the structure of FIG. 2 and may be variously changed according to design specifications of the display device.

The touch pads 170 are formed of the same material as the second bridges 154b through the same mask process as the second bridges 154b. The touch pads 170 are formed so as to cover the routing lines 156 and are thus directly connected to the routing lines 156 without separate contact holes.

Here, since the touch pads 170 are formed of the same material as the routing lines 156, the touch pads 170 having a greater area than the routing lines 156 exposed by the touch insulating film 158 are formed to cover the routing lines 156. Thereby, during an etching process of the touch pads 170, etching of the routing lines 156 arranged below the touch pads 170 may be prevented.

The touch pads 170 are formed so as to be exposed to the outside and are thus connected to a signal transmission film on which the touch driving unit (not shown) is mounted.

Display pads 180 are also arranged in the non-active (bezel) area in which the touch pads 170 are arranged. The touch pads 170 and the display pads 180 are arranged on at least one insulating film selected from the group consisting the buffer layer 112, the interlayer insulating film 114 and the protective film 116, which are arranged between the substrate 111 and the encapsulation unit 140, and contact the at least one insulating film. For example, the touch pads 170 and the display pads 180 may be arranged on the interlayer insulating film 114. The touch pads 170 and the display pads 180 may be arranged in at least one of one side region or the other side region of the substrate 111, as exemplarily shown in FIG. 2, or the touch pads 170 and the display pads 180 may be arranged in different regions of the non-active area. Arrangement of the touch pads 170 and the display pads 180 is not limited to the structure of FIG. 2, and may be variously changed according to design specifications of the display device.

The display pads 180 arranged in the non-active area have a multilayer structure, and the uppermost layer of the display pads 180 is formed of a different material from conductive layers included in the touch sensors. For example, each of the display pads 180 includes a display pad electrode 182 and a display cover electrode 184 serving as the uppermost layer, as exemplarily shown in FIG. 3.

The display pad electrode 182 is formed to be connected to at least one of the scan line SL, the data line DL, the low voltage (VSS) supply line or the high voltage (VDD) supply line in the active area in which the light emitting elements 120 are formed. The display pad electrode 182 is formed of the same material as at least one of the gate electrode 132 or the source and drain electrodes 136 and 138 of the driving transistor 130 (T2) so as to have a monolayer or multilayer structure on the same plane as the at least one of the gate electrode 132 or the source and drain electrodes 136 and 138. For example, the display pad electrode 172 having a monolayer structure is formed of the same material as the source and drain electrodes 136 and 138, on the interlayer insulating film 114, or is formed of the same material as the gate electrode 132, on the substrate 111. The display pad 172 having a multilayer structure includes a first display pad electrode (not shown) formed of the same material as the gate electrode 132, on the substrate 111, and a second display pad electrode (not shown) formed of the same material as the source and drain electrodes 136 and 138, on the interlayer insulating film 114 and connected to the first display pad electrode.

The display cover electrode 184 is located as the uppermost layer of the display pad 180 so as to cover the display pad electrode 182. The display cover electrode 184 is formed of a material having different etching characteristics from the materials of the first and second touch electrodes 152e and 154e, the bridges 152b and 154b, the touch pads 170 and the routing lines 156. That is, the pad cover electrode 184 includes a transparent conductive layer included in at least one of the anode 122 or the cathode 124. For example, the pad cover electrode 184 may be formed of a material having high corrosion resistance, such as indium thin oxide (ITO) or indium zinc oxide (IZO). Thereby, damage to the pad cover electrode 184 during etching processes of the first and second touch electrodes 152e and 154e, the bridges 152b and 154b, the touch pads 170 and the routing lines 156 may be prevented and, thus, process margin may be improved.

Figure 4A:
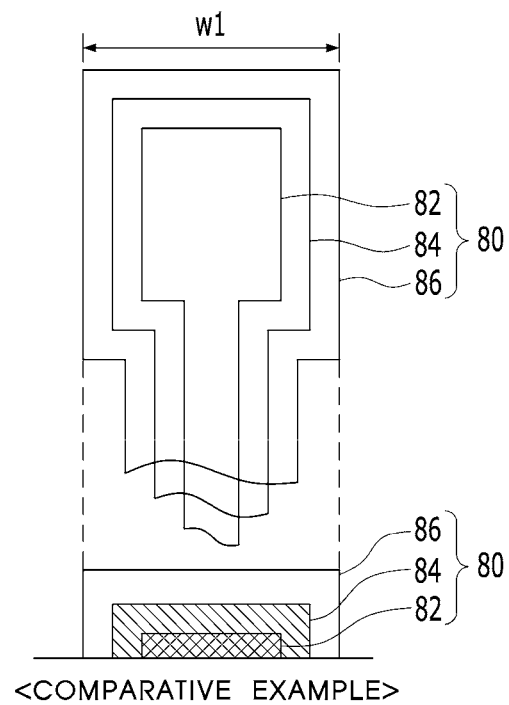
FIGS. 4A and 4B are plan and cross-sectional views illustrating a display pad in an example of the present disclosure shown in FIG. 3 and a display pad in a comparative example.
Figure 4B:
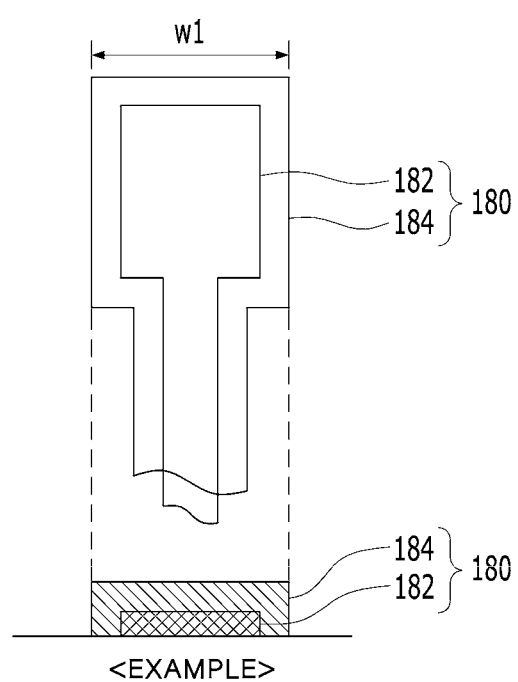

FIGS. 4A and 4B are plan and cross-sectional views illustrating a display pad in an example of the present disclosure and a display pad in a comparative example.

A display pad 80 in the comparative example shown in FIG. 4A includes a display pad electrode 82 and first and second pad cover electrodes 84 and 86, which are formed of the same material. The display pad electrode 82 extends from at least one of a scan line SL, a data line DL, a low voltage (VSS) supply line or a high voltage (VDD) supply line in an active area. The first pad cover electrode 84 is formed through the same mask process as touch electrodes and is thus formed of the same material as the touch electrodes and the display pad electrode 82. In this case, in order to prevent damage to the display pad electrode 82 formed of the same material as the first pad cover electrode 84, the first pad cover electrode 84 is formed to have a greater line width than the display pad electrode 82 so as to cover the display pad electrode 82. The second pad cover electrode 83 is formed through the same mask process as second bridges and is thus formed of the same material as the second bridges and the first pad cover electrode 84. In this case, in order to prevent damage to the first pad cover electrode 84 formed of the same material as the second pad cover electrode 86 during a patterning process of the second pad cover electrode 86 in the comparative example, the second pad cover electrode 86 is formed to have a greater line width than the first pad cover electrode 84. Thereby, the display pad 80 in the comparative example is formed to have a first line width w1.

On the other hand, the display pad 180 in the example of the present disclosure shown in FIG. 4B includes the display pad electrode 182 and the pad cover electrode 184, which are formed of different materials. The pad cover electrode 184 is formed through the same mask process as the anode 122 or the cathode 126 and is thus formed of the same material as the anode 122 or the cathode 126. In this case, the pad cover electrode 184 in the example of the present disclosure is formed to have a greater line width than the display pad electrode 182 formed of the same material as the touch electrodes 152e and 154e so as to cover the display pad electrode 182. Thereby, damage to the display pad electrode 182 formed of the same material as the touch electrodes 152e and 154e during a patterning process of the touch electrodes 152e and 154e may be prevented.

As such, the pad cover electrode 184 formed of a different material from the display pad electrode 182 and the touch electrodes 152e and 154e is arranged as the uppermost layer of the display pad 180 in the example of the present disclosure. The pad cover electrode 184 in the example of the present disclosure is formed to have a smaller second line width w2 than the first line width w1 of the second pad cover electrode 86 disposed as the uppermost layer of the display pad 80 in the comparative example. Thereby, the display pad 180 in the example of the present disclosure may minimize a line width, as compared to the display pad 80 in the comparative example, and, thus, high resolution may be implemented. Further, the display pad 180 in the example of the present disclosure includes the pad cover electrode 184 having a monolayer structure and may thus be formed through one patterning process, as compared to the display pad 80 including the first and second pad cover electrodes 84 and 86, and thereby process margin may be increased.

FIGS. 5A to 5F are cross-sectional views illustrating a method of manufacturing the organic light emitting display device shown in FIG. 3.

Figure 5A:
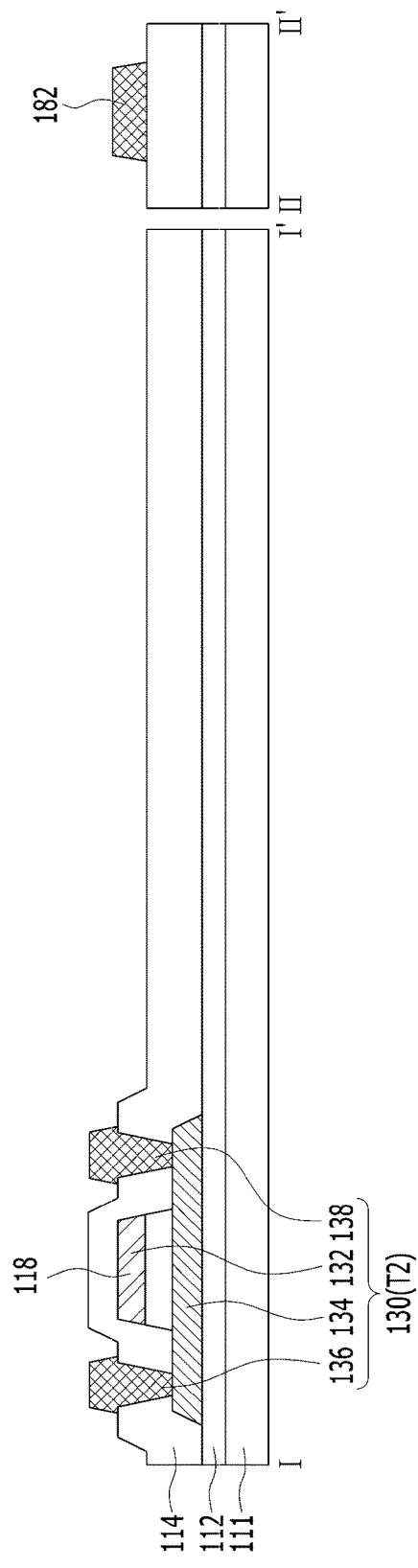
FIGS. 5A to 5F are cross-sectional views illustrating a method of manufacturing the organic light emitting display device shown in FIG. 3.

With reference to FIG. 5A, the switching transistors T1, the driving transistors 130 (T2) and the display pad electrodes 182 are formed on the substrate 111.

In more detail, the display pad electrodes 182, the switching transistors T1, and the active layer 134, the gate electrode 132 and the source and drain electrodes 136 and 138 of each of the driving transistors 130 (T2) are formed on the substrate 111 through a plurality of mask processes. Here, the display pad electrodes 182 are formed through the same mask process as at least one of the gate electrodes 132 or the source and drain electrodes 136 and 138 of the driving transistors 130 (T1) simultaneously with the at least one of the gate electrodes 132 or the source and drain electrodes 136 and 138. The display pad electrodes 182 are formed to have a monolayer or multilayer structure using a conductive layer having high corrosion resistance and acid resistance and excellent conductivity, such as Al, Ti, Cu and Mo. For example, the display pad electrodes 182 may have a three-layer structure, such as Ti/Al/Ti or Mo/Al/Mo.

Figure 5B:
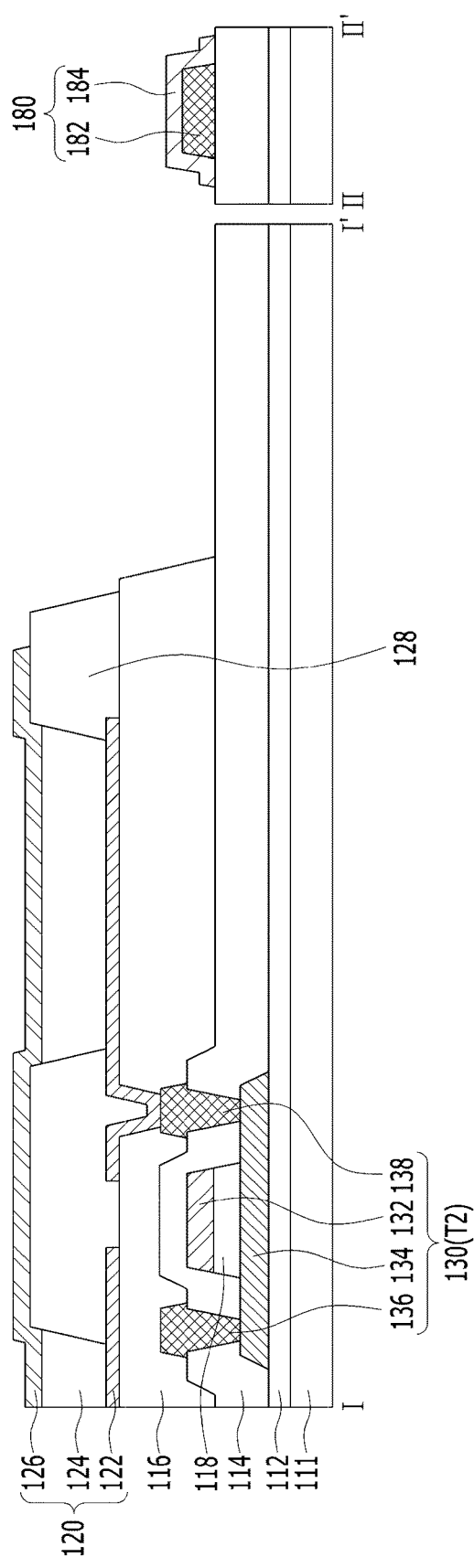

With reference to FIG. 5B, the organic light emitting elements 120 and the pad cover electrodes 184 are formed on the substrate 111 provided with the switching transistors T1, the driving transistors 130 (T2) and the display pad electrodes 182 formed thereon.

In more detail, the cover electrodes 184, and the anode 122, the at least one light emitting stack 124 and the cathode 126 of each of the organic light emitting elements 120 are formed on the substrate 111 provided with the switching transistors T1, the driving transistors 130 (T2) and the display pad electrodes 182 formed thereon through a plurality of mask processes. Here, the pad cover electrodes 184 are formed through the same mask process as a transparent conductive layer included in at least one of the anode 122 or the cathode 126. For example, IGZO, IZO, ITO or ZnO may be used as the transparent conductive layer.

Figure 5C:
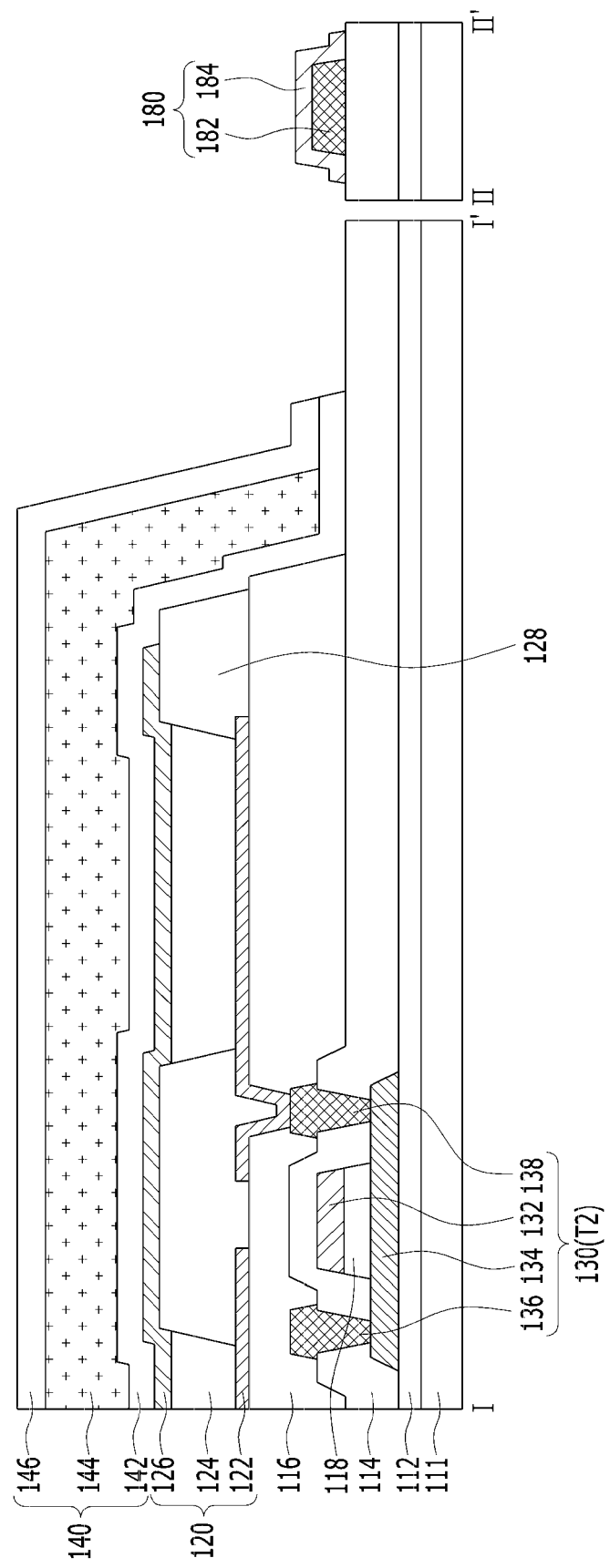

With reference to FIG. 5C, the encapsulation unit 140 is formed on the substrate 111 provided with the pad cover electrodes 184 and the organic light emitting elements 120 formed thereon.

In more detail, the first inorganic encapsulation layer 142 is formed on the substrate 111 provided with the pad cover electrodes 184 and the organic light emitting elements 120 formed thereon through a deposition process, such as chemical vapor deposition (CVD), low pressure chemical vapor deposition (LPCVD) or plasma enhanced chemical vapor deposition (PECVD). Here, the first inorganic encapsulation unit 142 is formed of $SiO_x$, $SiN_x$ or SiON. Thereafter, the organic encapsulation layer 144 is formed by coating an organic insulating material on the substrate 111 provided with the first inorganic encapsulation layer 142 formed thereon. Here, an organic insulating material, such as acrylic resin, epoxy resin, polyimide, polyethylene or silicon oxy-carbide (SiOC), is used as the organic encapsulation layer 144. Thereafter, the second inorganic encapsulation layer 142 is formed on the substrate 111 provided with the organic encapsulation layer 144 formed thereon through the above-described deposition process.

Figure 5D:
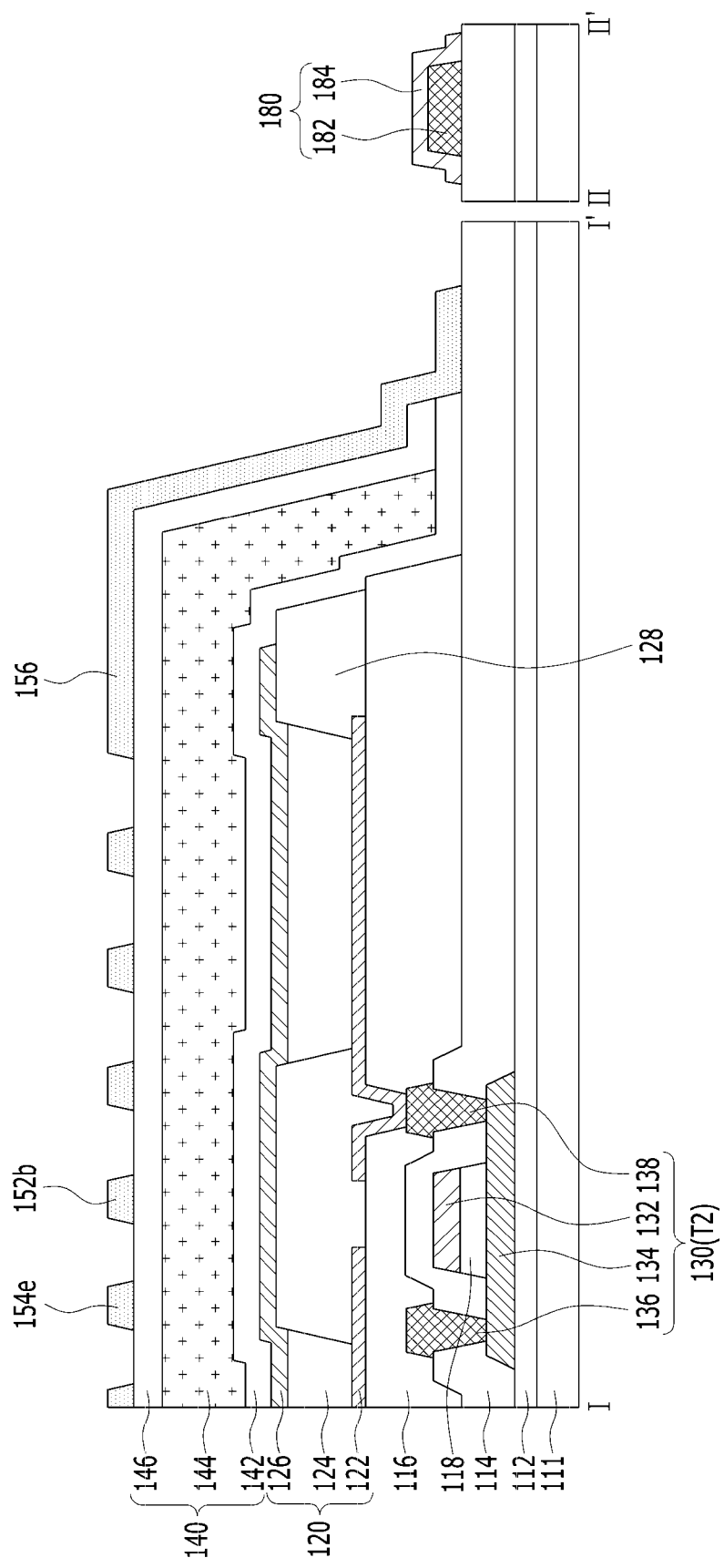

With reference to FIG. 5D, the first and second touch electrodes 152e and 154e, the first bridges 152b and the routing lines 156 are formed on the encapsulation unit 140.

In more detail, a first touch conductive layer is deposited on the whole surface of the substrate 111 provided with the encapsulation unit 140 formed thereon through a deposition process using sputtering. Thereafter, the first touch conductive layer is patterned through a photolithography process and an etching process, thus forming the first and second touch electrodes 152e and 154e, the first bridges 152b and the routing lines 156. Here, the first touch conductive layer is formed to have a monolayer or multilayer structure using at least one metal selected from the group consisting of Al, Ti, Cu, Mo, Ta and MoTi. Since the first touch conductive layer is formed of a material having different etching characteristics from the pad cover electrodes 184, damage to the pad cover electrodes 184 during the patterning process of the first touch conductive layer may be prevented.

Figure 5E:
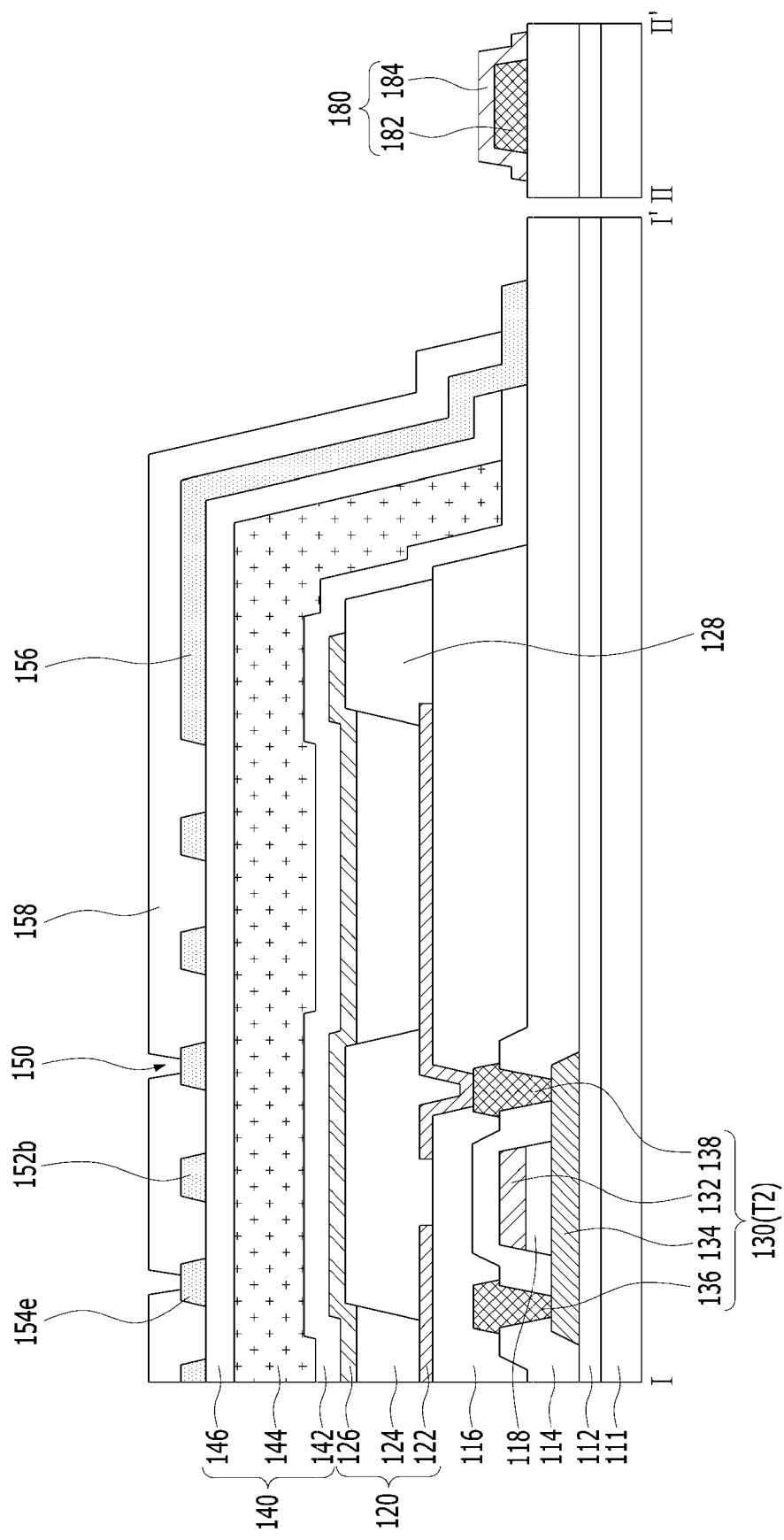

With reference to FIG. 5E, the touch insulating film 158 having the touch contact holes 150 is formed on the substrate 111 provided with the first and second touch electrodes 152e and 154e and the first bridges 152b formed thereon.

In more detail, the touch insulating film 158 is formed by stacking at least one of an organic insulating material or an inorganic insulating material on the substrate 111 provided with the first and second touch electrodes 152e and 154e and the first bridges 152b formed thereon. Thereafter, the touch insulating film 158 is patterned through a photolithography process and an etching process, thus forming the touch contact holes 150. Since the touch insulating film 158 is formed of a material having different etching characteristics from the pad cover electrodes 184, damage to the pad cover electrodes 184 during the patterning process of the touch insulating film 158 may be prevented.

Figure 5F:
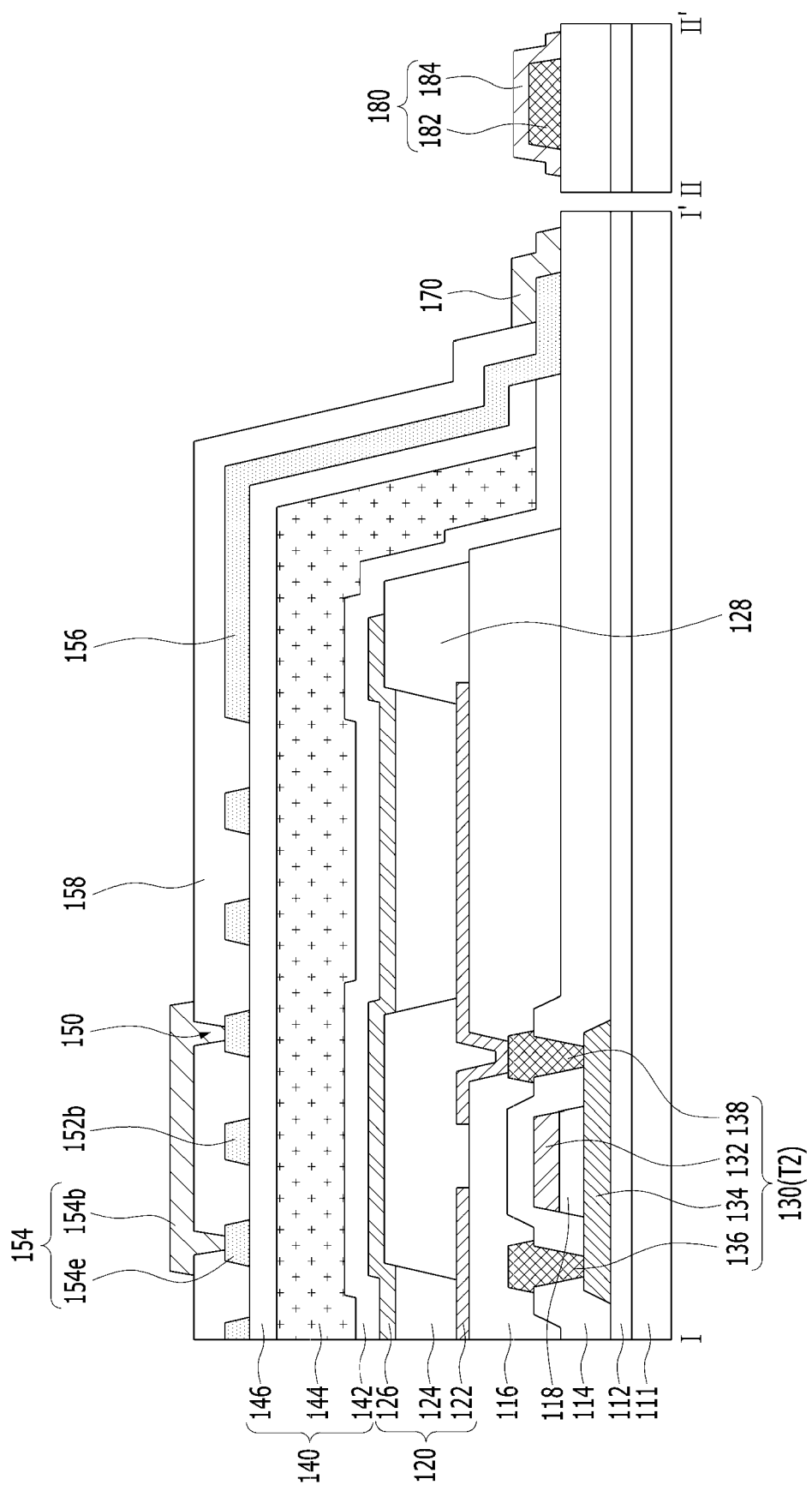

With reference to FIG. 5F, the second bridges 154b and the touch pads 170 are formed on the substrate 111 provided with the touch insulating film 158 having the touch contact holes 150.

In more detail, a second touch conductive layer is deposited on the whole surface of the substrate 111, provided with the touch insulating film 158 having the touch contact holes 150, at room temperature through a deposition process using sputtering and is then patterned through a photolithography process and an etching process, thus forming the second bridges 154b and the touch pads 170. Here, the second touch conductive layer is formed to have a monolayer or multilayer structure using at least one metal selected from the group consisting of Al, Ti, Cu, Mo, Ta and MoTi. Since the second touch conductive layer is formed of a material having different etching characteristics from the pad cover electrodes 184, damage to the pad cover electrodes 184 during the patterning process of the second touch conductive layer may be prevented.

As such, the display pad 180 in accordance with the present disclosure includes the pad cover electrode 184 having a monolayer structure, the patterning process of the pad cover electrode 184 may be limited to one time and thus process margin may be increased.

Figure 6:
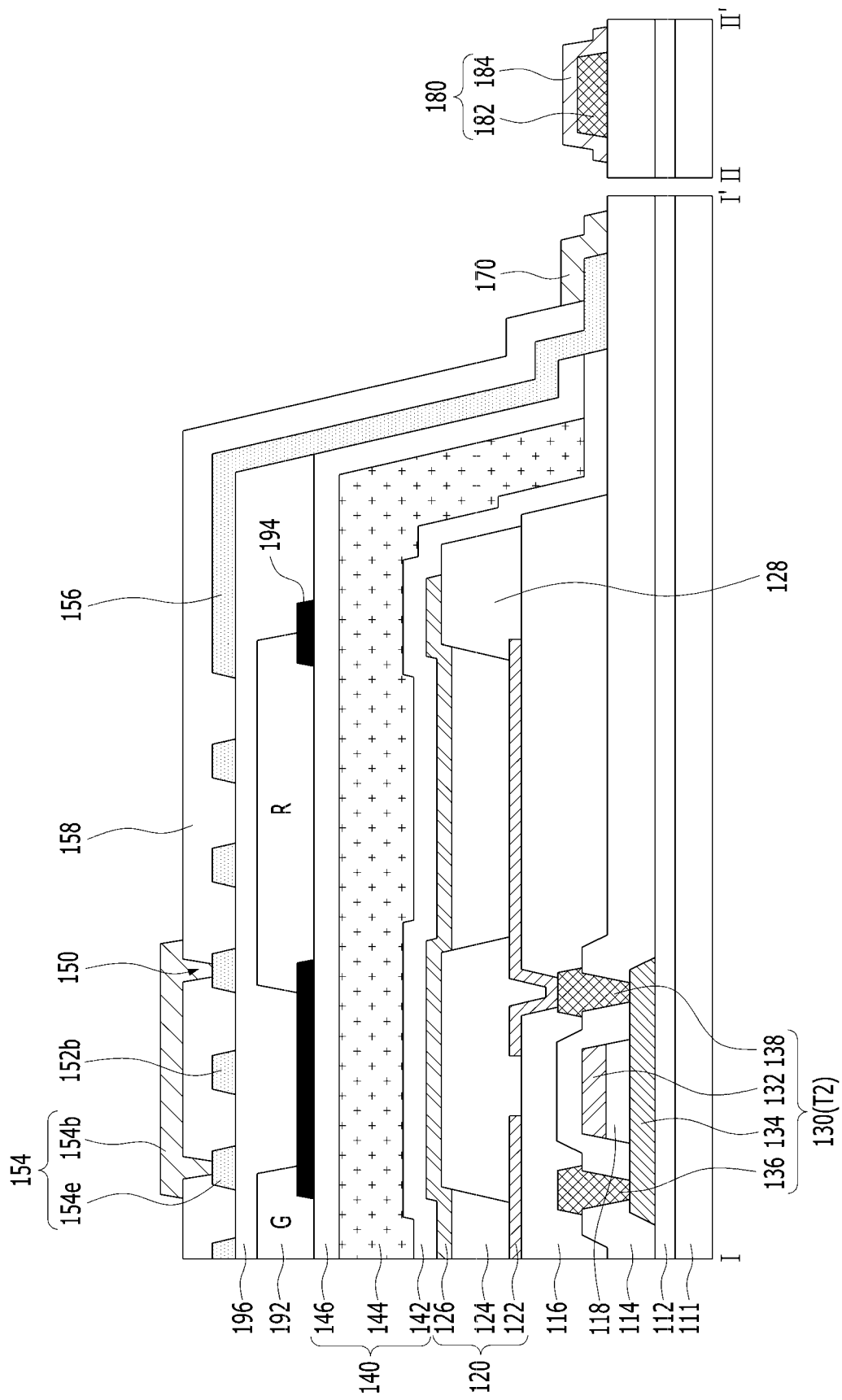
FIG. 6 is a cross-sectional view illustrating an organic light emitting display device having touch sensors in accordance with another embodiment of the present disclosure.

FIG. 6 is a cross-sectional view illustrating an organic light emitting display device having touch sensors in accordance with another embodiment of the present disclosure.

The organic light emitting display device shown in FIG. 6 includes the same elements as the organic light emitting display device shown in FIG. 3 except that color filters 192 arranged between an encapsulation unit 140 and touch electrodes 152e and 154e are further provided. Therefore, a detail description of the elements of the organic light emitting display device in accordance with this embodiment, which are the same as those of the organic light emitting display device in accordance with the earlier embodiment, will be omitted.

The color filter 192 is formed between each of touch driving and sensing 152 and 154 and a light emitting element 120. A distance between each of the touch driving and sensing lines 152 and 154 and the light emitting element 120 is increased by the color filter 192. Therefore, a capacitance value of a parasitic capacitor formed between each of the touch driving and sensing lines 152 and 154 and the light emitting element 120 may be minimized and, thus, mutual influence between each of the touch driving and sensing lines 152 and 154 and the light emitting element 120 due to coupling therebetween may be prevented. Further, the color filters 192 may prevent a liquid chemical (a developing solution or an etching solution) used during a manufacturing process of the touch sensing lines 154 and the touch driving lines 152 or external moisture from penetrating into at least one light emitting stack 124. Therefore, the color filters 192 prevent damage to the light emitting stack 124 which is vulnerable to a liquid chemical or moisture. Further, although FIG. 6 exemplarily illustrates that the touch electrodes 152e and 154e are arranged on the color filters 192, the color filters 192 may be arranged on the touch electrodes 152e and 154e. In this case, the touch electrodes 152e and 154e are arranged between the color filters 192 and the encapsulation unit 140.

A black matrix 194 is arranged between the color filters 192. The black matrix 194 serves to divide respective sub-pixel regions from each other and to prevent optical coherence and light leakage between neighboring sub-pixel regions. The black matrix 194 is formed of a black insulating material having high resistance, or is formed by stacking at least two color filters selected from the group consisting of red (R), green (G) and blue (B) color filters 192. Further, a planarization film 196 is formed on the substrate 111 provided with the color filters 192 and the black matrix 194 formed thereon. The planarization film 196 flattens the substrate 111 provided with the color filters 192 and the black matrix 194 formed thereon.

As such, in the organic light emitting display device having touch sensors in accordance with the present disclosure, the pad cover electrodes 184 serving as the uppermost layer of the display pads 180 are formed of a material having different etching characteristics from the touch electrodes 152e and 154e and the bridges 152b and 154b. Thereby, damage to the pad cover electrodes 184 during patterning processes of the touch electrodes 152e and 154e and the bridges 152b and 154b may be prevented, the pad cover electrodes 184 may be formed through one patterning process reduced from two patterning processes which are conventionally carried out and thus process margin may be increased.

Figure 7A:
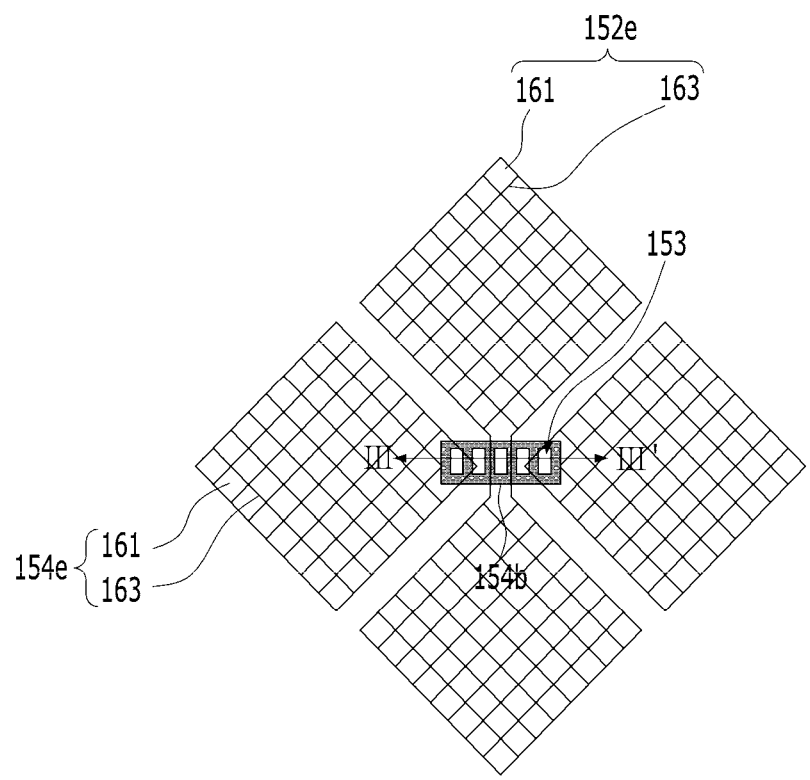
FIGS. 7A and 7B are plan and cross-sectional views, respectively, illustrating another type of a bridge of an organic light emitting display device having touch sensors in accordance with the present disclosure.
Figure 7B:
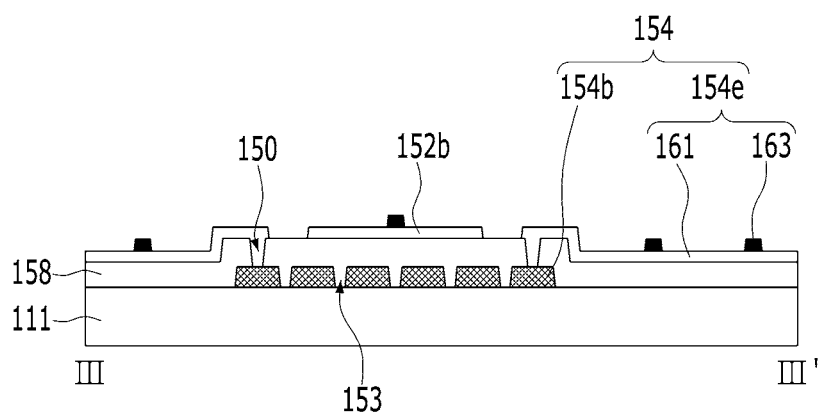

Although the present disclosure exemplarily describes a structure in which the second bridges 154b are arranged on the touch insulating film 158 and the first and second touch electrodes 152e and 154e and the first bridges 152b are arranged on the encapsulation unit 140, the second bridges 154b may be arranged on the encapsulation unit 140 and the first and second touch electrodes 152e and 154e and the first bridges 152b may be arranged on the touch insulating film 158, as exemplarily shown in FIGS. 7A and 7B.

Further, although the present disclosure exemplarily describes a structure in which each of the first and second touch electrodes 152e and 154e includes the mesh-type conductive layer, a transparent conductive layer 161 may be arranged on or under a mesh-type conductive layer 163, as exemplarily shown in FIGS. 7A and 7B. Here, IGZO, IZO, ITO or ZnO may be used as the transparent conductive layer 161.

Further, the first and second bridges 152b and 154b in accordance with the present disclosure may include a plurality of slits 153, as exemplarily shown in FIGS. 7A and 7B. The second bridge 154b including the slits 153 shown in FIGS. 7A and 7B may have a reduced area, as compared to the second bridge 154b including no slits shown in FIG. 3. Therefore, reflection of external light by the second bridges 154b may be reduced and, thus, lowering of visibility may be prevented.

Moreover, although the present disclosure exemplarily describes the mutual capacitive touch sensors formed between the touch sensing lines 154 and the touch driving lines 152 intersecting each other, the present disclosure may be applied to self-capacitive touch sensors Cs.

As apparent from the above description, in a display device in accordance with the present disclosure, pad cover electrodes serving as the uppermost layer of display pads are formed of a material having different etching characteristics from touch electrodes and bridges and, thus, damage to the pad cover electrodes during patterning processes of the touch electrodes and the bridges may be prevented. Further, in the display device in accordance with the present disclosure, the pad cover electrodes may be formed through one patterning process reduced from two patterning processes which are conventionally carried out and thus process margin may be increased. Moreover, while a touchscreen is attached to a conventional organic light emitting display device through an adhesive, the touch electrodes are arranged on an encapsulation unit of the display device in accordance with the present disclosure without a separate attachment process and, thus, process simplification and cost reduction may be achieved.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   light emitting elements arranged in an active area on a substrate;
   an encapsulation unit arranged on the light emitting elements, wherein the encapsulation unit includes a plurality of inorganic encapsulation layers and at least one organic encapsulation layer;
   touch sensors arranged on the encapsulation unit, the touch sensors including a first conductive layer;
   display pads arranged in a non-active area on the substrate, the display pads having a multilayer structure;
   touch pads connected to the touch sensors and spaced apart from the display pads; and
   routing lines configured to conductively connect the touch sensors to the touch pads, the routing lines disposed along lateral surfaces of an inorganic encapsulation layer of the plurality of inorganic encapsulation layers that covers a lateral surface of the organic encapsulation layer,
   wherein an uppermost layer of the display pads is formed of a different material than the first conductive layer included in the touch sensors.

2. The display device according to claim 1, wherein the uppermost layer of the display pads is formed of a material having different etching characteristics than the first conductive layer included in the touch sensors.

3. The display device according to claim 1,
   wherein the touch pads include a second conductive layer,
   wherein the routing lines include a third conductive layer, and
   wherein the uppermost layer of the display pads is formed of a different material than the second and third conductive layers included in the touch pads and the routing lines, respectively.

4. The display device according to claim 1, wherein each of the display pads comprises:
   a display pad electrode connected to signal lines arranged in the active area; and
   a pad cover electrode located at an uppermost region of the display pad, wherein the pad cover electrode covers the display pad electrode.

5. A display device, comprising:
   light emitting elements arranged in an active area on a substrate;
   an encapsulation unit arranged on the light emitting elements;
   touch sensors arranged on the encapsulation unit, the touch sensors including a first conductive layer;
   display pads arranged in a non-active area on the substrate, the display pads having a multilayer structure;
   touch pads connected to the touch sensors and spaced apart from the display pads; and
   thin film transistors connected to the signal lines,
   wherein each of the display pads comprises:
      a display pad electrode connected to signal lines arranged in the active area; and
      a pad cover electrode located at an uppermost region of the display pad, wherein the pad cover electrode covers the display pad electrode,
   wherein each of the light emitting elements comprises:
      an anode connected to a respective one of the thin film transistors;
      a cathode disposed opposite to the anode; and
      at least one light emitting stack arranged between the anode and the cathode,
   wherein the pad cover electrode is formed of a same material as a transparent conductive layer included at least one of the anode or the cathode.

6. A display device, comprising:
   light emitting elements arranged in an active area on a substrate;
   an encapsulation unit arranged on the light emitting elements;
   touch sensors arranged on the encapsulation unit, the touch sensors including a first conductive layer;

display pads arranged in a non-active area on the substrate, the display pads having a multilayer structure; and thin film transistors connected to the signal lines, wherein each of the display pads comprises:
- a display pad electrode connected to signal lines arranged in the active area; and
- a pad cover electrode located at an uppermost region of the display pad, wherein the pad cover electrode covers the display pad electrode, wherein the touch sensors comprise touch sensing lines and touch driving lines arranged on the encapsulation unit so as to intersect each other, wherein each of the touch driving lines comprises:
- first touch electrodes arranged in a first direction on the encapsulation unit; and
- first bridges configured to connect the first touch electrodes, wherein each of the touch sensing lines comprises:
- second touch electrodes arranged in a second direction intersecting the first direction; and
- second bridges configured to connect the second touch electrodes, wherein the pad cover electrodes are formed of a different material than at least one of the first and second touch electrodes and the first and second bridges.

7. The display device according to claim 6, wherein each of the first and second touch electrodes and the first and second bridges has a monolayer or multilayer structure including at least one of Ti, Al, Mo, MoTi, Cu and Ta.

8. The display device according to claim 6, wherein at least one of the first and second touch electrodes and the first and second bridges is formed as a mesh.

9. The display device according to claim 6, wherein at least one of the first bridges or the second bridges includes at least one slit.

10. The display device according to claim 1, further comprising color filters arranged between the encapsulation unit and the touch sensors.

11. The display device according to claim 1, further comprising color filters arranged on the touch sensors,
wherein the touch sensors are arranged between the color filters and the encapsulation unit.

12. The display device according to claim 5, further comprising:
at least one lower insulating film arranged between the substrate and the encapsulation unit,
wherein the routing lines contact side surfaces of the encapsulation unit and the at least one lower insulating film, and the display pads and the touch pads contact the at least one lower insulating film.

13. The display device according to claim 12, further comprising:
a buffer layer arranged between an active layer of the thin film transistors and the substrate;
an interlayer insulating film arranged between gate electrodes and source and drain electrodes of the thin film transistors; and
a protective film arranged between the source and drain electrodes and the light emitting elements,
wherein the at least one lower insulating film includes at least one of the buffer layer, the interlayer insulating film or the protective film.

14. The display device according to claim 1, wherein the display pads and the touch pads are arranged in one row, in plan view.

* * * * *